(12) United States Patent
Adusumalli et al.

(10) Patent No.: US 11,692,872 B2
(45) Date of Patent: Jul. 4, 2023

(54) REDUCING DARK CURRENT IN AN OPTICAL DEVICE

(71) Applicant: AMS INTERNATIONAL AG, Jona (CH)

(72) Inventors: Ravi Kumar Adusumalli, Eindhoven (NL); Rohit Ranganathan, Eindhoven (NL); Vijay Ele, Eindhoven (NL)

(73) Assignee: AMS INTERNATIONAL AG, Jona (CH)

( * ) Notice: Subject to any disclaimer, the term of this patent is extended or adjusted under 35 U.S.C. 154(b) by 7 days.

(21) Appl. No.: 17/619,943

(22) PCT Filed: Jul. 29, 2020

(86) PCT No.: PCT/EP2020/071447
§ 371 (c)(1),
(2) Date: Dec. 16, 2021

(87) PCT Pub. No.: WO2021/018986
PCT Pub. Date: Feb. 4, 2021

(65) Prior Publication Data
US 2022/0299362 A1   Sep. 22, 2022

Related U.S. Application Data

(60) Provisional application No. 62/880,307, filed on Jul. 30, 2019.

(51) Int. Cl.
| G01J 1/44 | (2006.01) |
| H03F 3/45 | (2006.01) |
| G01J 1/42 | (2006.01) |
| H03F 3/38 | (2006.01) |
| H03M 1/06 | (2006.01) |

(52) U.S. Cl.
CPC ............ *G01J 1/44* (2013.01); *H03F 3/45475* (2013.01); *G01J 2001/446* (2013.01)

(58) Field of Classification Search
CPC .. G01J 1/44; G01J 2001/446; G01J 2001/444; H03F 3/45475; H03F 3/38; H03M 1/123; H03M 1/56; H03M 1/0607
See application file for complete search history.

(56) References Cited

U.S. PATENT DOCUMENTS 4,341,956 A * 7/1982 Bax ........................ G01J 1/44
                                                327/515
9,541,449 B2 * 1/2017 Wagner ................ G01J 1/0252

FOREIGN PATENT DOCUMENTS

| CN | 105352593 A | 2/2016 |
| JP | H11 8518 A | 1/1999 |
| WO | 20110025048 A2 | 3/2011 |

OTHER PUBLICATIONS

International Search Report and Written Opinion for corresponding PCT Patent Application No. PCT/EP2020/071447 dated Oct. 21, 2020.

(Continued)

*Primary Examiner* — Seung C Sohn
(74) *Attorney, Agent, or Firm* — Tarolli, Sundheim, Covell & Tummino L.L.P

(57) ABSTRACT

An optical light sensing device includes a detector operable to detect a light wave. The optical light sensing device also includes an integration circuit that includes an operational amplifier that is operable to reduce or cancel dark currents generated at the detector.

12 Claims, 8 Drawing Sheets

(56) References Cited

OTHER PUBLICATIONS

Khiarak MN et al: "An Energy-Efficient CMOS Biophotometry Sensor With Incremental DT-[sum] [Delta] ADC Conversion", 2018 IEEE International Symposium on Circuits and Systems (ISCAS), IEEE, May 27, 2018 (May 27, 2018), pp. 1-4, XP033435080, DOI: 10.1109/ISCAS.2018.8351652.

* cited by examiner

REDUCING DARK CURRENT IN AN OPTICAL DEVICE

RELATED APPLICATIONS

The present invention is a U.S. National Stage under 35 USC 371 patent application, claiming priority to Ser. No. PCT/EP2020/071447, filed on 29 Jul. 2020; which claims priority from U.S. Provisional Patent Application No. 62/880,307 filed on 30 Jul. 2019; the entireties of both are hereby incorporated herein by reference.

FIELD

This specification relates to integrated circuits for optical sensing devices.

BACKGROUND

Integrated circuits (ICs) may include various components for use in optical light sensing devices. One example of such an IC uses a package having a light emitter and a photodetector in order to produce and detect light. More specifically, in some cases, light may be produced by the emitter and be reflected from an object back to the photodetector. The photodetector produces a representation (e.g., an electrical signal) of the detected light.

The electrical signal or representation may be processed and used in accordance with particular applications to obtain information about the object. Sensing apparatus, such as devices for color detection, presence detection, motion detection, and proximity sensing, frequently use such optical sensing methods to obtain information about an object. For example, the information that is obtained can include a color of the object, relative motion of the object, or approximate distance of the object relative to the sensing apparatus.

SUMMARY

Light sensor applications that include photodetectors are susceptible to measurement distortions caused by leakage current ("dark currents") that is generated when a voltage is applied to the photodetector. For example, dark current can be leakage current that occurs when a bias voltage is applied to a photodiode. In some cases, there can be higher dark current that varies directly with temperature. For example, an amount of dark current that is generated may vary by M for every N degree (e.g., degrees Celsius) increase in temperature at the light sensor, where M and N are integers.

In this context, techniques are described for implementing a circuit including a sensor architecture that is operable to reduce or remove dark current generated during each light measurement. The sensor architecture reduces the dark current by using a count-to-count chopping technique that concurrently adjusts (e.g., switches) an input polarity and an output polarity of an operational amplifier in the circuit to cause cancellation of a dark current signal that is generated during a given light measurement cycle. This concurrent switching of the respective input and output polarities provides a method that is effective at reducing the dark counts across a variety of temperature ranges.

Other implementations of this disclosure and other aspects include corresponding systems, apparatus, and computer programs configured to perform the actions of the methods and encoded on computer storage devices. A computing system of one or more computers or hardware circuits can be so configured by virtue of software, firmware, hardware, or a combination of them installed on the system that in operation cause the system to perform the actions. One or more computer programs can be so configured by virtue of having instructions that, when executed by data processing apparatus, cause the apparatus to perform the actions.

The subject matter described in this specification can be implemented to realize one or more of the following advantages. The techniques described in this document provide improved cancellation of dark currents by enabling continuous cancellation of dark currents that are generated for every ambient light sensor (ALS) measurement cycle of an optical device. Using the described methods, an example dark count value, e.g., that indicates an amount of generated dark current, can be zero, or near zero, for every light-to-frequency measurement irrespective of the size of a photodiode used in the optical light sensing device and/or temperatures at the optical light sensing device.

The described approach for reducing (or eliminating) dark currents can be used to design and develop color and ambient light sensors that have higher precision, e.g., in low or very low-light conditions, relative to conventional optical devices. Moreover, the techniques can be integrated in existing optical light sensing devices with little or no changes/modifications to existing hardware features, software features, or calibration processes of the optical light sensing device.

Other aspects, features and advantages will become apparent from the following detailed description, the accompanying drawings, and the claims.

DETAILED DESCRIPTION

Figure 1:
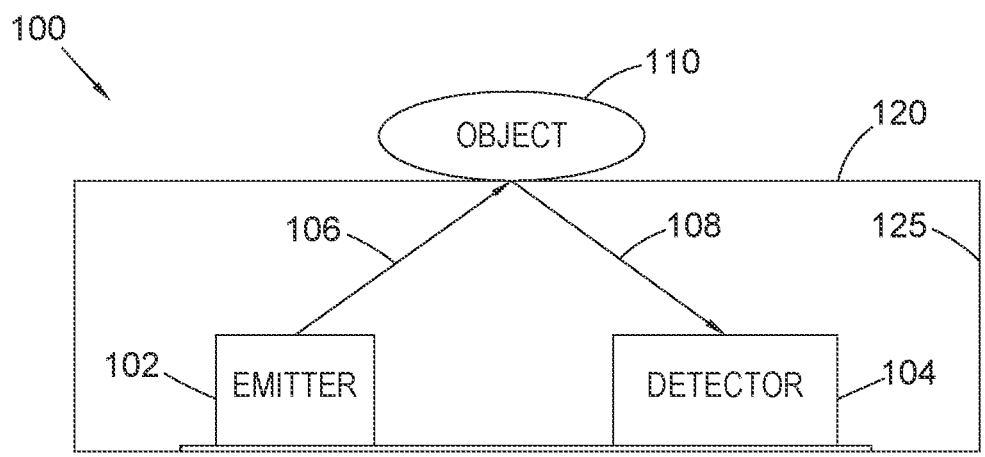
FIG. 1 is a block diagram of an example optical sensing system.

Optical sensors can include a light-to-frequency (L2F) sensor architecture. For example, an ambient light sensor (ALS) can employ this sensor architecture for applications where a light sensor is used to obtain an accurate measurement of ambient light. In other examples, the L2F sensor architecture may be employed in a color sensor that is used to determine certain color attributes of light detected by the sensor. The L2F sensor architecture includes a light sensor disposed in a housing that has an optical or glass surface. For example, a detector such as a photodiode of a light sensor can be enclosed in a device package and disposed adjacent to, or under, a darkened glass surface of the device package. In general, the darkened glass surface will have reduced transparency or translucency relative to a glass surface that is not darkened.

Light sensors enclosed in device packages that include a darkened glass surface require a larger detector area, e.g., larger photodiode surface area, relative to light sensors that do not include the darkened glass surface. The larger detector area is required to obtain a particular sensitivity for a given electrical gain from the light sensor. However, the larger detector area often translates to a larger leakage current at the detector, which limits the detectors ability to accurately or effectively perform low light measurements. This larger leakage current may be referred to herein as "dark current." To address challenges relating to such leakage current, this document describes techniques for a light sensor architecture that is operable to reduce, e.g., substantially reduce, or remove dark current that can occur when the sensor performs a light measurement.

For example, techniques are described for implementing a circuit for a sensor architecture that is operable to reduce or remove dark current generated during each light measurement. The sensor architecture reduces the dark current based on a count-to-count chopping technique in which a respective polarity at an input and an output of an operational amplifier in the circuit is switched, changed, or otherwise adjusted at each count interval of an analog-to-digital converter (ADC) such that dark current signals generated during light measurement cycles are effectively reduced or cancelled. Hence, the described techniques are useful for achieving zero, or close to zero, counts of dark current for a broad temperature range at an optical light sensing device, thereby enabling a light sensor disposed in a device that employs a darkened glass surface to measure low light signals more accurately. Moreover, the described circuit can be easily integrated into a variety of existing architectures for optical devices that include detectors for sensing light.

Optical light sensors can include both an emitter and detector in a device package. The device package generally represents a physical device structure of an optical sensor or optical light sensing device. The device package defines an internal cavity where the emitter and detector can be positioned. In general, the emitter emits a signal that interacts with a target object outside the package, which reflects a signal detectable by the detector. Each of the emitted signal and the reflected signal can be light waves, such as emitted and reflected rays of IR light, respectively.

FIG. 1 is a block diagram of an example optical sensing system 100. System 100 can represent an integrated circuit (IC) or an optical light sensing device, such as one or multiple optical light sensing devices. In some examples, the optical light sensing device is a color detection sensor, and the reflected signal detected by the detector is used to determine colors of a target object (e.g., produce or poultry) relative to the optical device. In other examples, the optical device may be disposed in a mobile/smartphone device, and the detected reflected signal is processed at the mobile device to determine whether the smartphone is positioned adjacent a person's ear. In some cases, the optical devices are used for proximity detection, time-of-flight (TOF) applications, or light detection and ranging (LIDAR) applications.

System 100 includes an emitter 102, such as a light emitting diode (LED) or vertical-cavity surface-emitting laser (VCSEL), and a detector 104, such as a photodetector. In some cases, detector 104 is alternatively referred to as a sensor and may be a photodiode operable to sense (e.g., detect) light waves at a surface section of the detector.

Emitter 102 can be operable, for example, to generate a signal of a particular wavelength, and the detector 104 can be a sensor operable to sense the signal produced by the emitter 102. The emitter 102 and detector 104 may be disposed in, or otherwise located in, an optical device represented by system 100. The emitter 102 can be configured to produce visible or non-visible light of a desired wavelength. For example, in some instances, the emitter 102 is operable to produce light waves that have a wavelength in the near-infrared (NIR) spectrum in the range of 750 nanometers (nm) to 1400 nm.

As described in more detail below, the emitter 102 produces light, and the detector 104 incorporates special-purpose circuitry to reduce an amount of dark current that is generated in response to the detector sensing or detecting photons of light energy that may be associated with the light produced by the emitter 102. The special-purpose circuitry enables the detector to detect low light energy signals, particularly when the detector includes large substrate and/or is disposed in a device package that has a darkened glass surface.

The emitter 102 can be fabricated directly onto an IC of system 100 or may include an IC chip or other modular component that is added to the IC of system 100 during or after fabrication of the IC. The emitter 102 may be a single emitter or may represent multiple emitters (e.g., an array of emitters). In some implementations, the detector 104 is operable to detect light of varying wavelengths. For example, the detector 104 is operable to detect light of a wavelength produced by the emitter 102 (e.g., in the range of 850 nm to 940 nm) or light of a wavelength produced by light sources other than the emitter 102.

The detector 104 may also be fabricated directly onto an IC of system 100 or may include an IC chip or other modular component that is added to the IC of system 100 during or after fabrication of the IC. The detector 104 may be a single detector or may represent multiple detectors (e.g., an array of detectors). In some implementations, system 100 is an optical sensor that includes both an emitter 102 and a detector 104 in a single device package 120. The device package 120 generally represents a physical device structure of an optical sensor or optical light sensing device.

For purposes of example, emitter 102 and detector 104 may be used for a variety of applications, including presence detection, motion detection, color detection, and other related applications in which an emitted signal is later detected and processed or analyzed. In the implementation of FIG. 1, the system 100 is an optical device that emits a signal for sensing a target object. The signal can correspond to an example light wave 106 that is associated with a reflected light wave 108.

As noted above, the optical device can include both the emitter 102 and detector 104 in a device package that defines an internal cavity 125. The light wave 106 emitted by emitter 102 interacts with a target object 110 to cause the reflected light wave 108. The target object 110 is external to the device package 120. In this manner, the emitted light wave 106 exits the internal cavity 125 of the optical device after being emitted for sensing attributes of the target object 110, and the reflected light wave 108 enters the internal cavity 125 of the optical device in response to the emitted light wave 106 interacting with, or reflecting off, the target object 110.

Figure 2:
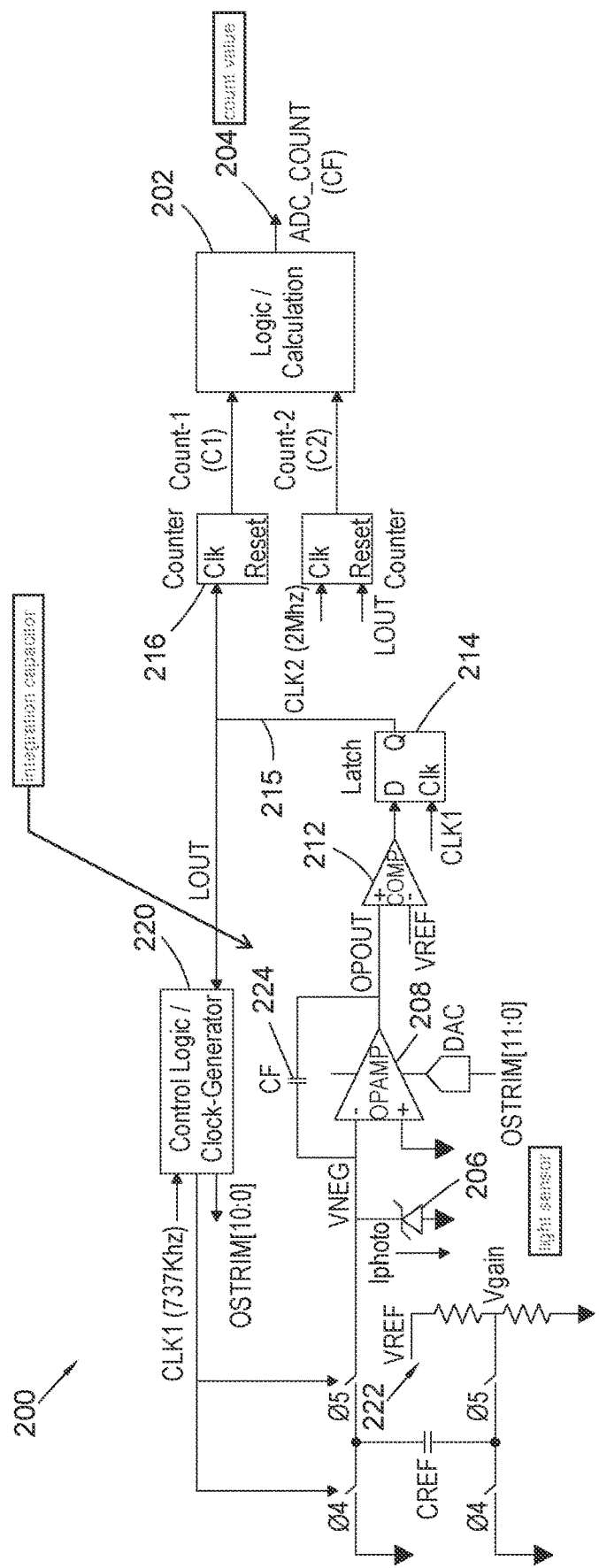
FIG. 2 is a circuit diagram of a sensor arrangement for an example light sensing architecture.

FIG. 2 is a diagram of an example circuit 200 that includes a sensor arrangement for an example light sensing architecture. In some implementations, circuit 200 is disposed or located in an example optical light sensing device to account of dark current generated at the device. Circuit 200 shows a known sensing architecture for implementing an ambient light sensor.

Circuit 200 generally includes a calculation logic 202 that is operable to generate a count value 204 represented by a parameter ADC_count. The count value 204 is an analog-to-digital converter (ADC) count that represents detected dark current during a measurement cycle of an optical light sensing device and for a given ambient light condition. The ambient light condition may be a completely dark light condition, a low light condition, or a variety of other light conditions that represent an amount of ambient light in an environment where an example light/optical sensing device that includes circuit 200 is located.

A basic operation principle of an ALS is that a charge balancing ADC collects photon current generated from a photodiode (PD), such as a detector 102. The ADC converts the photon current to an ALS count (e.g., ADC_count). In some implementations, the ALS count is based on a charge conservation equation:

$$ADC\_COUNT = (T_{int} * I_{photo})/(C_{REF} * V_{REF}). \quad (1)$$

In the equation (1) above, variable $T_{int}$ corresponds to an integration time for integrating a sensor signal generated by an example light sensor and is described in more detail below.

The calculation logic 202 can be associated with an example integrating ADC. In some implementations, calculation logic 202 is associated with a charge balancing ADC that receives a signal representing a photo current $I_{photo}$ generated by a light sensor 206, e.g., a photodiode such as detector 104. The circuit 200, including calculation logic 202, is operable to convert a respective sensor signal that represents $I_{photo}$ into ADC counts, as indicated by count value 204.

Circuit 200 includes an operational amplifier 208 ("op-amp 208") and an integration capacitor 224. In some implementations, the capacitor 224 is an external feedback component of the op-amp 208 that cooperates with the op-amp 208 to perform integration on the sensor signal generated by detector 206. For example, current $I_{photo}$ can be integrated by means of the op-amp 208 and integration capacitor 224. An integrated sensor signal is received at comparator 212 for comparison with a reference voltage $V_{REF}$ generated by a reference circuit 222. Comparator 212 generates a comparison signal that is received at a latch device 214. Latch device 214 passes the comparison signal as a clock signal 215 to counter 216 for generating a counter signal. The counter signal is provided to calculation logic 202 to generate or increment an ADC_count value 204.

An example controller 220 provides a clock signal for controlling one or more operations of circuit 200. In some implementations, if a charge integrated into the capacitor 224 is larger than a unit charge packet determined by the reference circuit 222, the controller 220 will increment a number of counts by one count and the charge on the integration capacitor 224 will be decreased by one unit charge packet. This function corresponds to charge dumping of the integration capacitor 224. In some implementations, integrating a sensor signal is performed for a certain integration time period, such as 100 milliseconds (ms). The integration time period can be determined by a system clock, such as a local clock included at circuit 200. In some examples, a number of ADC_count generated or acquired by circuit 200 during the integration time period is a measure of brightness of ambient light conditions at a light sensor.

In some examples, during a completely dark light condition detector 206 will not generate a current $I_{photo}$ and count value 204, which indicates the number of detected ADC counts, will be zero. However, this mode of operation can represent ideal or optimal performance of a light sensing device, which is not easily achievable given the challenges of minimizing a voltage potential across a detector. For example, if a voltage across detector 206 (e.g., a photodiode) is not equal to zero, the detector will generate a leakage current, $I_{leak}$ based on the equation:

$$I_{leak} = I_s * \left[ e^{\frac{V_{neg}}{\frac{KT}{q}}} - 1 \right] \quad (2)$$

In equation (2), $$\frac{KT}{q}$$

is a physical constant indicating a thermal voltage value. In some implementations, this leakage current grows exponentially over a temperature range and can degrade the light sensing functions of an optical light sensor device. For example, a finite dark count, dark_count, that corresponds to the ADC_count in completely dark light condition, such as when ambient light is zero, can exist at the detector and limit a light sensors low bound (or low light) performance. During this performance mode the detected dark_count is also based on charge conservation equation:

$$Dark\_count = (T_{int} * I_{leak})/(C_{REF} * V_{REF}) \quad (3)$$

In some implementations, a magnitude of the leakage current is temperature dependent and gain dependent. The gain refers to example gain value of op-amp 208 that is applied to a dark current signal generated at circuit 200. For example, the leakage current can increase substantially at specific temperatures or temperature ranges. In some examples, the leakage current reaches peak values at approximately 70 degrees Celsius and at the highest gain for op-amp 208 (e.g., 512×). These increases in the magnitude of the leakage current can be a limiting factor in the overall performance of an ALS.

Figure 3A:
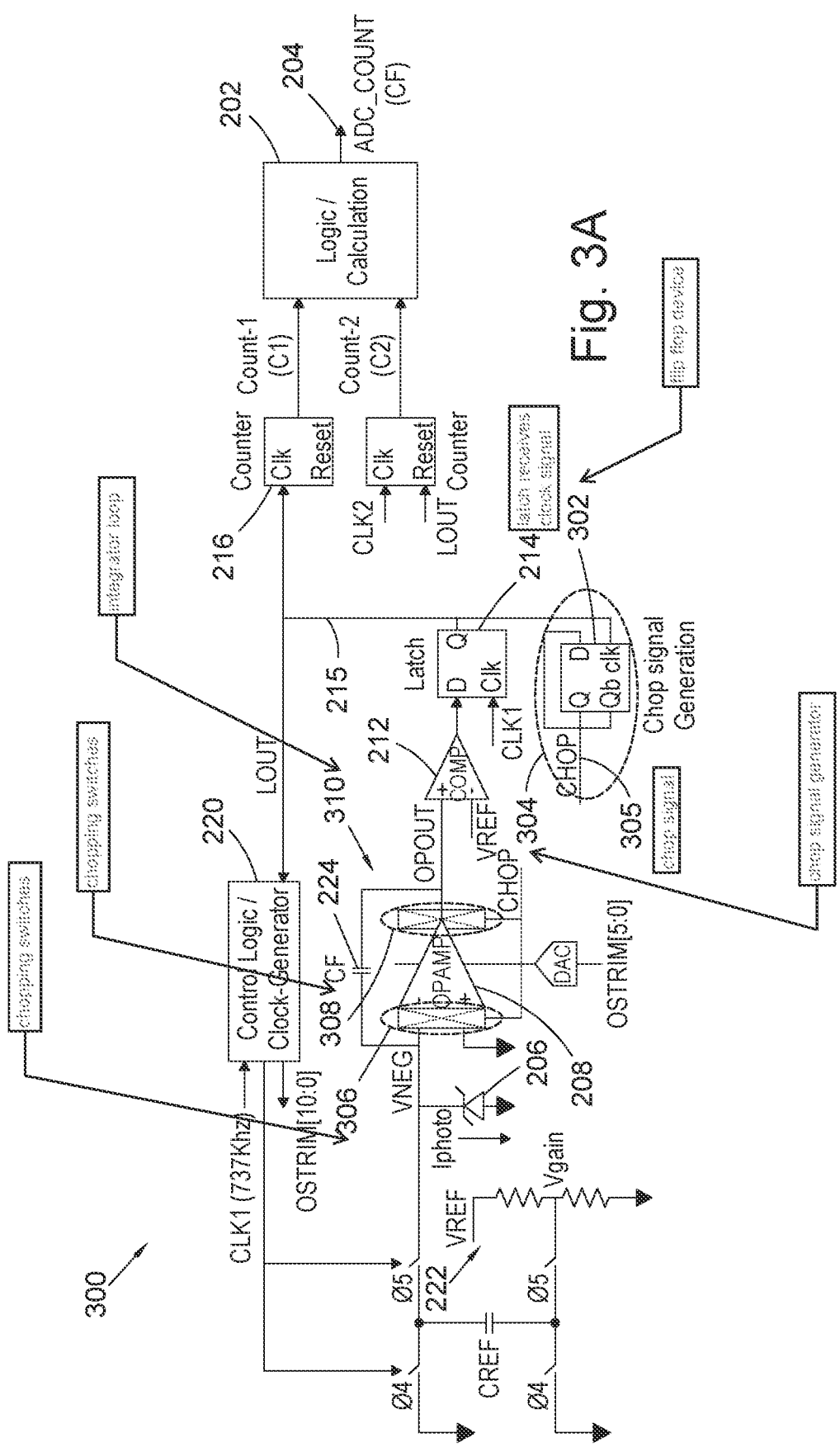
FIG. 3A and FIG. 3B are circuit diagrams that depict components of an example light sensing architecture that is operable to reduce dark currents generated by a detector.

FIG. 3 is a diagram of an example circuit 300 that includes light sensing architecture. Circuit 300 is operable to reduce dark currents generated by a detector 206 disposed in a light sensing device. For example, the sensor and component configuration of circuit 300 provides reductions in dark counts by implementing cycle-to-cycle (e.g., count-to-count) chopping. As described in more detail below, the sensor arrangement of circuit 300 can be easily adapted to provide continuous dark current cancellation in a variety of light sensing architectures.

The circuit 300 includes a light-to-frequency converter that is operable to cancel a generated dark current for each measurement cycle by chopping that dark current signal, e.g., using count-to-count chopping, each time the integrator, represented by op-amp 208 and integration (or feedback) capacitor 224, is required to reset. For example, using circuit 300, the chopping technique is implemented to concurrently switch the input polarity of op-amp 208 and the output polarity of op-amp 208 to cause cancellation of a dark current signal that is generated during a given light measurement cycle. This concurrent switching of the respective input and output polarities causes corresponding reductions or cancellations of dark counts across a variety of temperature ranges. Moreover, this count-to-count chopping allows the light sensor to perform accurate light sensing measurements even in low or very low-light conditions. In some implementations, circuit 300 is operable to reduce a dark count for various temperature ranges while also enabling accurate light sensor measurements during low light conditions.

Circuit 300 includes a chop signal generator 304 that is used to implement a particular chopping technique to reduce dark counts detected by the circuit. In some implementations, circuit 300 is formed by adapting circuit 200 to include the chop signal generator 304 having an example flip flop device 302 (e.g., a D flip flop) that receives a clock signal 215 generated by latch 214 based on the comparison signal generated by comparator 212. The clock signal 215 derived from the comparison signal provides a clock input to the flip flop device 302 that corresponds to the chop signal generator 304.

The chop signal generator 304 is operable to generate a chop signal 305. As described below, the chopping signal 305 is provided to chopping switches 306 and 308 for implementing the example chopping technique (discussed above) in response to the clock signal 215. For example, the flip flop device 302 can be a D flip flop that provides divide by two functionality. The input to this D flip-flop 302 corresponds to the clock signal 215 generated by the latch 214. The D flip fop 302 is operable to generate and output the output chopping signal 305 (indicated as CHOP in FIG. 3A). Chopping signal 305 can be a logic signal that changes states alternatively for each edge of the clock signal 215 generated by latch 214. For example, an initial output CHOP (signal 205) of D flip-flop 302 can be at a low logic (e.g., zero) for a first clock pulse 215 generated by latch 214, whereas a subsequent output CHOP of D flip-flop 302 can be at a low high (e.g., one) for a second, different clock pulse 215 generated by latch 214, and so on. In some implementations, the chopping technique is implemented based on the count-to-count time that is defined in accordance with timing signals corresponding to respective counter/clock signals C1 and C2.

For example, the chopping technique can be a continuous process that includes applying an offset voltage across the detector 206 for each of the positive and negative signal polarities of the op-amp 208. Application of the offset causes prior offset voltage effects to be averaged out with reference to the detector 206, which can lead to substantial reduction or elimination of dark current for each measurement cycle at circuit 300. This chopping technique is applied inside an integrator loop 310 of circuit 300 and does not affect a settling behavior of the integrator.

For example, the chopping technique is operable to switch polarities of the op-amp 208 to reduce a current offset of the op-amp 208 and to cause a corresponding reduction or cancellation of a dark current signal generated at the detector 206. In some implementations, prior to integration, the circuit 300 is operable to determine a minimum voltage across the detector 206. For example, the circuit 300 uses an initialization time corresponding to an auto-zero time to determine a minimum voltage across the detector 206. The auto-zero time can correspond to an imposed overhead or sampling time for obtaining an accurate measurement of the minimum voltage across the detector 206. A trim bit (OS-TRIM) can be configured in accordance with the determined minimum voltage. The trim bit is used by circuit 300 for tuning the op-amp 208 (e.g., the op-amp gain values) to reduce the current offset of the op-amp 208 based on the determined minimum voltage. In some implementations, the circuit 300 is operable to use a trim bit that can be set to as low as 6-bits of offset. This trim bit setting can achieve reductions in an overhead sampling time (e.g., relative to 8-bits or 12-bits of offset that require more sampling time) while still allowing circuit 300 to obtain an accurate measurement of the minimum voltage across the detector 206.

The circuit 300 can include chopping switches 306 and 308 (described below with reference FIG. 3B) inside the integrator loop 310 formed using op-amp 208 and integration capacitor 224. In some implementations, each of chopping switches 306 and 308 represent a respective set of switches that are configured to change or switch an input polarity of op-amp 208 (i.e., using switches 306) and an output polarity of op-amp 208 (i.e., using switches 308). Namely, chopping switches 306 are operable to switch or transition between a positive and a negative polarity at the two input terminals of op-amp 208, whereas chopping switches 308 are operable to cause a switching or transitioning between a positive and negative polarity at the output of the op-amp 208.

In some implementations, the changes in polarity caused by the chopping switch transitions occur in a charge dump state of integration capacitor 224. For example, the charge packet $C_{REF} \cdot V_{REF}$ previously charged onto the reference circuit 222 is connected to the integration node $V_{NEG}$ and discharges the charge present on the integration capacitor 224 (charge dumping). In some examples, this discharging stops after a certain amount of time that may be defined by the system clock, CLK1. The sensor arrangement of circuit 300 is operable to reduce or cancel the dark current continuously or to trigger dark current cancellation for every ALS measurement cycle. In this way, the proposed component arrangement of circuit 300 can reduce or eliminate dark current over multiple ALS measurement cycles irrespective of the detector size and temperature.

Figure 3B:
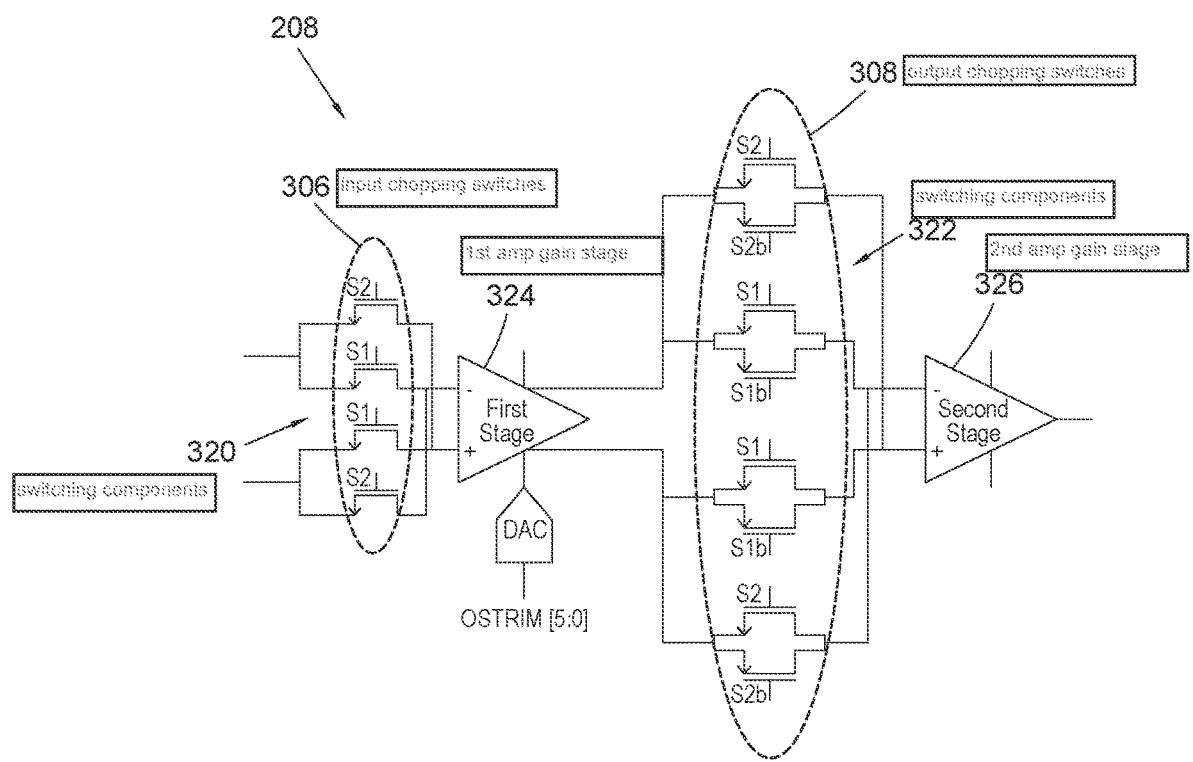

FIG. 3B is a circuit diagram that depicts the switches 306 and 308 in example an embodiment of op-amp 208. As shown in FIG. 3B, the op-amp 208 includes respective sets of switching components 320, 322 that are disposed at an input to a first amplifier gain stage 324 of op-amp 208 and at an input to a second amplifier gain stage 326 of op-amp 208. Specifically, the first set of switches 320 disposed at the input to the first amplifier gain stage 324 are configured to switch the input polarity of op-amp 208 between a positive and negative polarity and the second set of switches 322 disposed at the input to the second amplifier gain stage 326 are configured to switch the output polarity of op-amp 208 between a positive and negative polarity.

The count-to-count chopping technique is implemented in accordance with (i) a particular switching configuration of the switches 306 that are connected at the negative terminal of the op-amp 208 (corresponding to gain stage 324) and (ii) a particular switching configuration of the switches 308 that are connected at the output terminal of the op-amp 208 (corresponding to gain stage 326). The configuration shown at FIG. 3B indicates that, relative to op-amp 208, each of switches 306 and switches 308 are connected in such a way that the integrator loop 310 of circuit 300 is in negative feedback.

In this manner, during an example operation of circuit 300 the switches 306 can be connected so that an input signal path to the first (input) gain stage 324 is connected to a negative terminal of an amplifier at gain stage 324. Similarly, the switches 308 are also connected so that an input signal path to the second (output) gain stage 326 is connected to a negative terminal of an amplifier at gain stage 326. When a count value of parameter ADC_count increments by one count, the switches 306 function to swap or switch a connection at the first gain stage 324 to cause a polarity change from negative to positive so that the input signal path to gain stage 324 is now connected to a positive terminal of the amplifier at that gain stage. Concurrently, switches 308 also function to cause a corresponding polarity change to occur at the input signal path to gain stage 326 based on a swapping or switching of the connection to a positive terminal of the amplifier at that gain stage 326.

A subsequent incrementing of the count value of parameter ADC_count causes another corresponding swapping of the respective connection of switches 306 at the terminals of the input gain stage 324 and the connection of switches 308 at the terminals of the output gain stage 326. This count-to-count chopping mechanism functions to cancel a dark current signal generated at detector 206. In some examples, the concurrent swapping of the polarity connections at the terminals of the respective gain stages 324, 326 coincides with the time of charge dumping the amplifier output voltage.

In some implementations, the set of switches 320 that switch the input polarity of op-amp 208 are configured to be switched concurrently with the set of switches 322 that switch the output polarity of op-amp 208. The respective set of switches 320 and 322 are configured to be switched concurrently in response to the chopping signal 305 generated by the chop signal generator 304. In some examples, each set of switches 322 and 324 include multiple transistor switches and two or more of the transistor switches in each set 322, 324 can be arranged in a cross-coupled configuration, diode-connected configuration, or a combination of each. In other examples, circuit 300 can include other types of switches that are operable to provide the same or substantially similar switching functions as the switching functionality provided by transistor switches.

Figure 4:
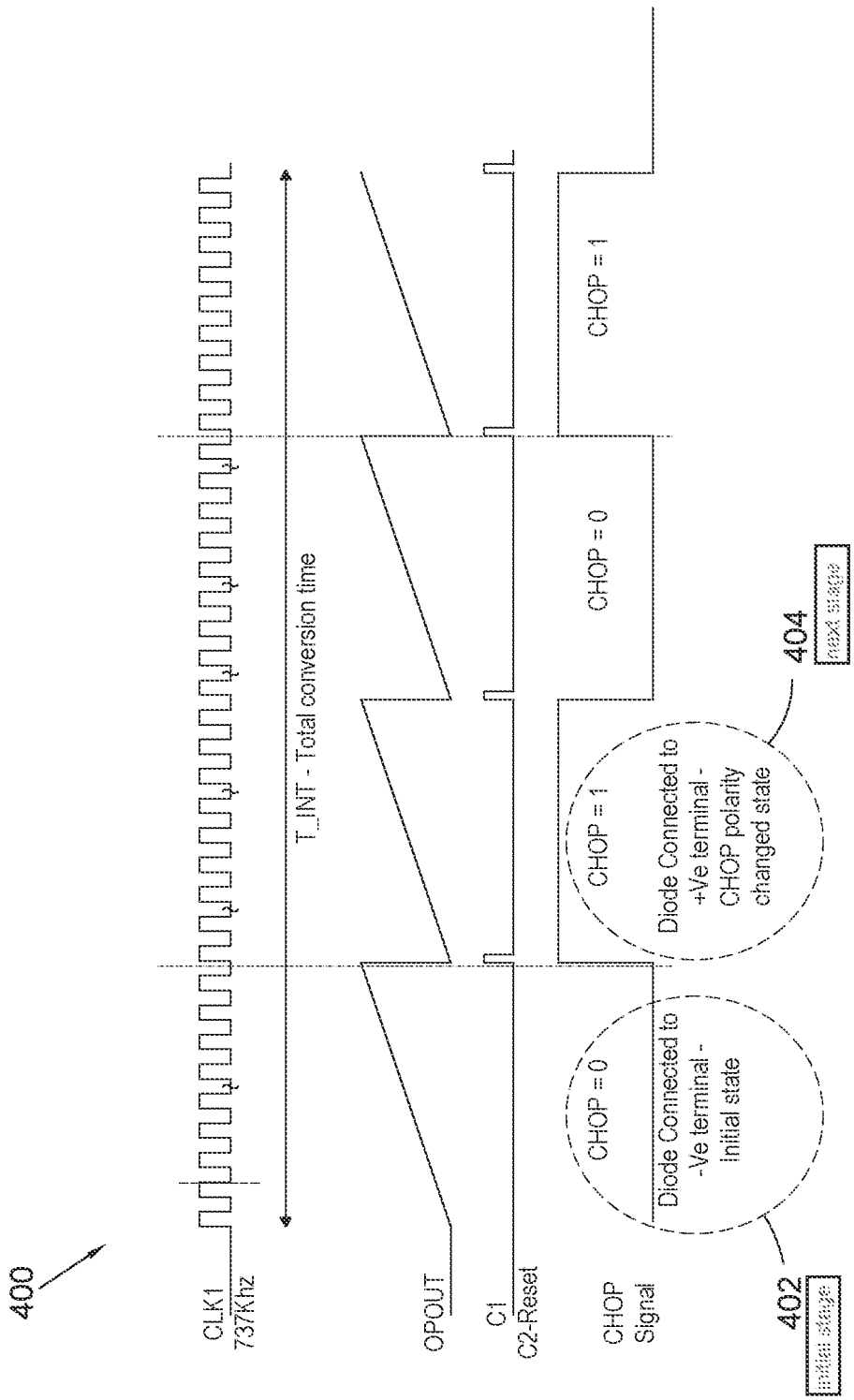
FIG. 4 shows an example output waveform that indicates a chopping technique associated with the light sensing architecture of FIG. 3A and FIG. 3B.

FIG. 4 shows an example output waveform that indicates a chopping technique associated with the light sensing architecture of circuit 300 shown at FIG. 3.

As indicated by FIG. 4, during an example initial state 402, because of a positive offset voltage, +Ve offset, at the negative terminals of the op-amp 208, the integrator loop 310 integrates the signal as a charging of the feedback capacitor 224. In a next state 404, the chopping signal 305 causes the switches 306, 308 to change the polarity at the op-amp 208 to reflect an opposite polarity of a negative offset voltage, —Ve offset, at the positive terminals of the op-amp 208. In this manner, the voltage across the feedback capacitor 224 can be decreased or discharged because of the corresponding negative dark current or because of the current sink diode configuration of the switches 306, 308.

In some implementations, the detected dark current signal can be proportional to the offset voltage that corresponds to the detected voltage across the detector 206. In some examples, the detected dark current signal can have the same magnitude as the magnitude of the offset voltage signal. The sum of the two dark currents (+Ve dark current signal and −Ve dark current signal) cancel the effect of the dark current on the output (OPOUT) of the op-amp 208. In this way, using the switch configuration of switches 306 and 308 as well as the chop signal generator 304, circuit 300 is operable to cancel the dark current by using the described count-to-count chopping technique.

Figure 5:
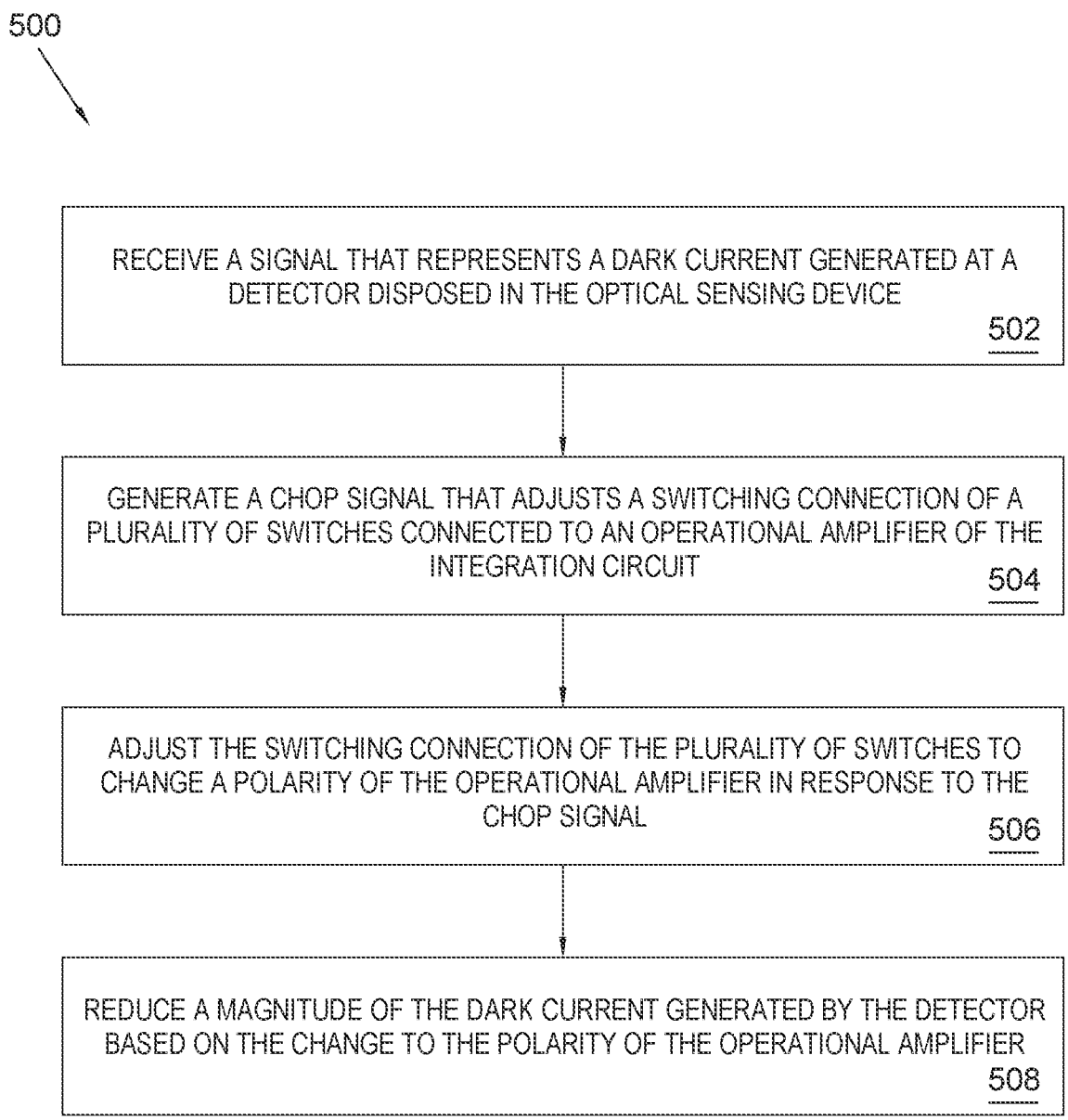
FIG. 5 shows an example process for reducing dark current generated by a detector in response to sensing light.

FIG. 5 shows an example process 500 for reducing dark current generated by a detector disposed in an optical sensing device. In some implementations, process 500 is performed using a light sensing architecture 300 integrated at optical light sensing system 100.

Referring now to process 500, circuit 300 receives a signal that represents a dark current generated at a detector 206 disposed in the optical sensing device (502). For example, the signal is received by an integration circuit that includes an operational amplifier (op-amp 208) and a multiple switches 306, 308 that are connected to the operational amplifier. In some implementations, the op-amp 208 processes one or more signals generated by the detector 206 based on a switching connection of the multiple switches. Circuit 300 generates a chopping signal 305 that adjusts a switching connection of the multiple switches that are connected to the operational amplifier (504). For example, the chopping signal 305 is generated by a chop signal generator 304 that is coupled to the integration circuit.

The circuit 300 adjusts the switching connection of the multiple switches to change a polarity of the operational amplifier in response to the chopping signal (506). For example, the signal that represents the dark current can be received at a terminal of the operational amplifier that has a negative input polarity based on a first switch configuration of the multiple switches. In response to receiving the chopping signal 305 generated by the chop signal generator 304, circuit 300 is operable to adjust the switching connection to cause the terminal of the operational amplifier to have a positive input polarity based on a second, different switch configuration of the multiple switches. For example, the positive input polarity can correspond to a negative feedback at the integration loop 310. In some examples, negative feedback occurs by feeding a portion of the output signal back to the negative or inverting input terminal of the op-amp 208. The integration circuit is operable to integrate a portion of the output signal of the op-amp 208 as a charge on integration capacitor 224. For example, integration circuit begins integrating a voltage output (OPOUT) of the op-amp 208 when the voltage reaches threshold reference voltage, Vref.

The integration circuit reduces a magnitude of the dark current generated by the detector based on the change to the polarity of the operational amplifier (508). In some implementations, the integration circuit is operable to generate an output signal that is proportional to an integral of the input voltage. A magnitude of the output signal of the op-amp 208 is proportional to a magnitude of the input signal to the op-amp 208 as a current through the feedback loop charges or discharges the capacitor when the required negative feedback occurs using the integration capacitor 224. The integration circuit reduces the magnitude of the dark current generated by the detector based on a capacitor discharge voltage of the negative feedback loop that is discharged to reduce the magnitude of the dark current.

In some implementations, the light sensing architecture of circuit 300 is integrated in a sensing system 100 that is installed in a host device, such as a mobile smartphone, tablet, in-ear headphones, a wearable device, or other electronic device. In such implementations, the advantages of light sensing architecture 300 that pertain to reducing, attenuating, or blocking dark current generated by a detector translates to improved sensing features as well as other detection features at the host device. For example, the sensing system 100 may be integrated in a host device, and the reflected light wave signal 108 is processed at the host device by detector 104 to more accurately determine whether the host device is positioned adjacent an ear of a person's head.

In some implementations, the host device receives signals from the detector and uses one or more processing devices to adjust a feature of the host device in response to receiving the signals from the detector. For example, the host device can adjust a brightness of a display screen integrated at the host device, turn off the display screen, or cause the host device to transition from a locked operating state to an unlocked operating state. In some examples, the host device, or circuitry associated with the detector 104, includes one or more processors that are configured to execute instructions to cause performance of operations for adjusting features of the host device in response to receiving the signals from the detector 104.

Figure 6:
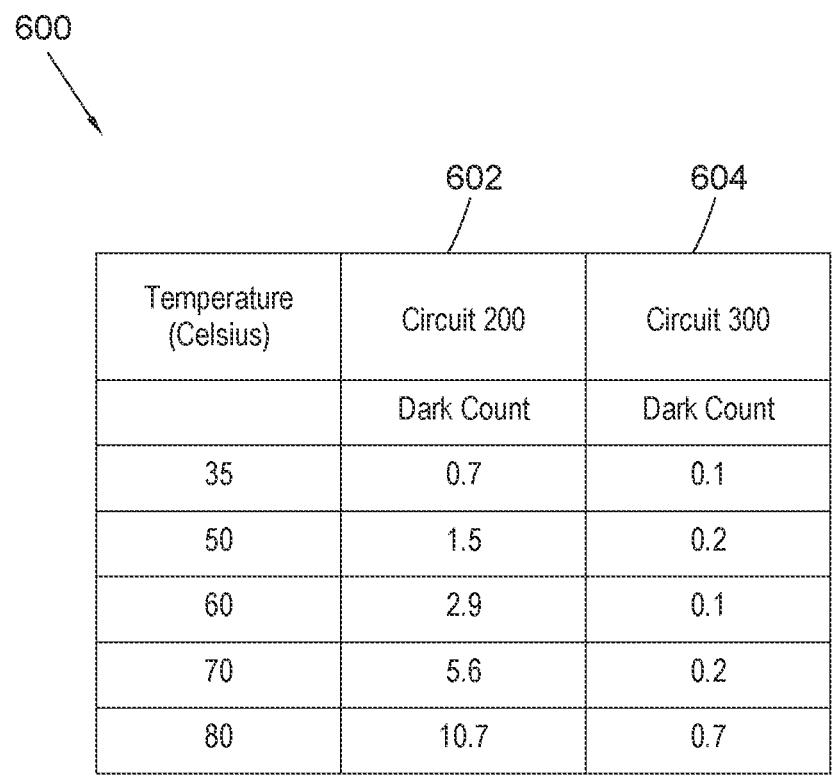
FIG. 6 is a table that illustrates dark count results associated with the light sensing architecture of FIG. 3.
Figure 7:
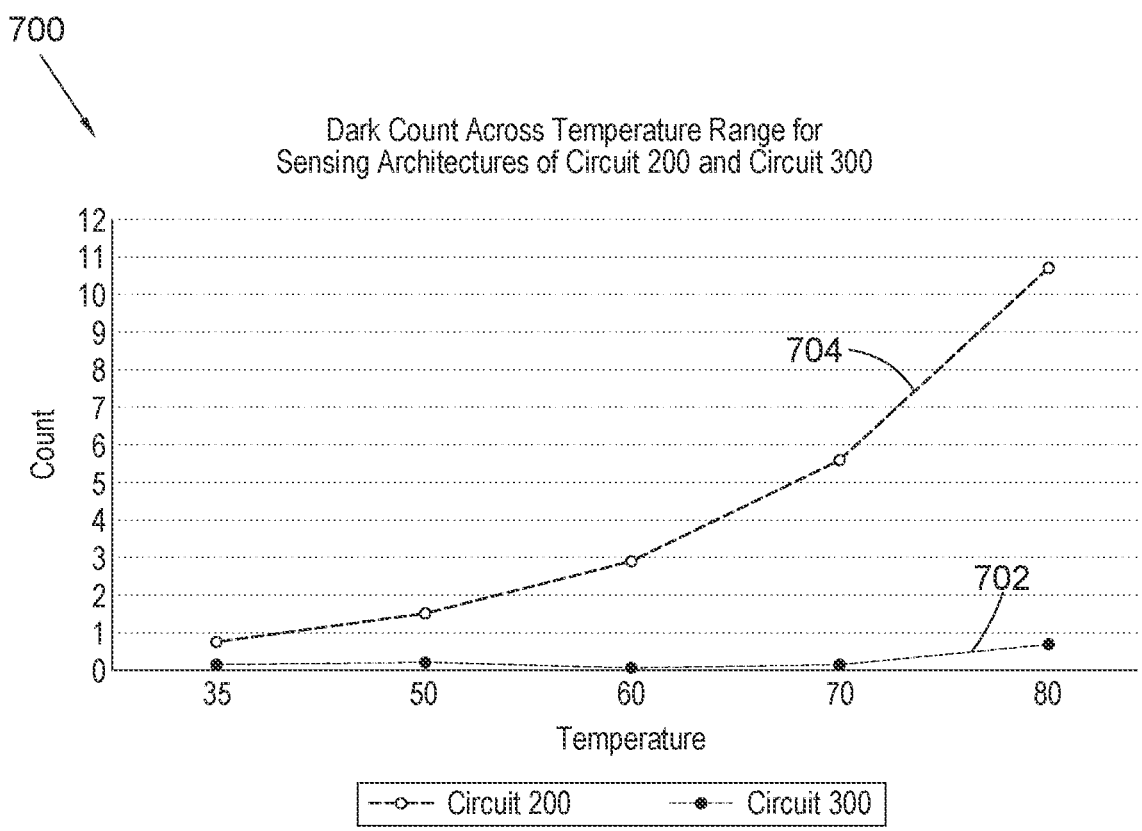
FIG. 7 is a graph that illustrates dark count results associated with the light sensing architecture of FIG. 3.

FIG. 6 is a table 600 that illustrates dark count results associated with the light sensing architecture and corresponding circuit 300 of FIG. 3. FIG. 7 is a graph 700 that illustrates dark count results associated with the light sensing architecture of FIG. 3. In particular, graph 700 shows that Dark_count across an example temperature range for the circuit 200 and for circuit 300. As depicted in FIG. 7, the Dark Count with the offset voltage of +/−~200 uV in the architecture of circuit 200 is higher (>10 counts) relative to the reduced dark count of 0.20 counts (<1 count at max) overserved circuit 300. This graphical data indicates that the dark count performance improved by ~10× for circuit 300.

Various implementations of the systems and techniques described here can be realized in digital electronic circuitry, integrated circuitry, specially designed ASICs, computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs, also known as programs, software, software applications or code, include machine instructions for a programmable processor, and can be implemented in a high-level procedural and/or object-oriented programming language, and/or in assembly/machine language. In some implementations, the computer programs are used by a controller of a host device (e.g., a smartphone or tablet). For example, the controller uses the programs to control operation of an emitter disposed in the host device and to process signals generated by a detector disposed in the host device. The signals generated by the detector are processed in response to the detector receiving reflected light corresponding to light waves emitted by the emitter.

As used herein, the terms "machine-readable medium" "computer-readable medium" refers to any computer program product, apparatus and/or device, e.g., magnetic discs, optical disks, memory, Programmable Logic Devices (PLDs) used to provide machine instructions and/or data to a programmable processor, including a machine-readable medium that receives machine instructions as a machine-readable signal. The term "machine-readable signal" refers to any signal used to provide machine instructions and/or data to a programmable processor.

To provide for interaction with a user, the systems and techniques described here can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

The systems and techniques described here can be implemented in a computing system that includes a back-end component, e.g., as a data server, or that includes a middleware component such as an application server, or that includes a front-end component such as a client computer having a graphical user interface or a Web browser through which a user can interact with an implementation of the systems and techniques described here, or any combination of such back-end, middleware, or front-end components. The components of the system can be interconnected by any form or medium of digital data communication such as, a communication network. Examples of communication networks include a local area network ("LAN"), a wide area network ("WAN"), and the Internet.

The computing system can include clients and servers. A client and server are generally remote from each other and typically interact through a communication network. The relationship of client and server arises by virtue of computer programs running on the respective computers and having a client-server relationship to each other.

A number of embodiments have been described. Nevertheless, it will be understood that various modifications may be made without departing from the spirit and scope of the invention. Further, while this specification contains many specific implementation details, these should not be construed as limitations on the scope of what may be claimed, but rather as descriptions of features that may be specific to particular embodiments. Certain features that are described in this specification in the context of separate embodiments can also be implemented in combination in a single embodiment.

Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products. Accordingly, other implementations are within the scope of the following claims.

The invention claimed is:

1. A circuit implemented in an optical sensing device, the circuit comprising:
   a detector operable to detect a light wave to determine an attribute of an object, wherein the detector is susceptible to generating a dark current;

an integration circuit comprising an operational amplifier and a plurality of switches that are connected to the operational amplifier, wherein the operational amplifier processes one or more signals generated by the detector based on a switching connection of the plurality of switches; and a chop signal generator coupled to the integration circuit, wherein the chop signal generator is operable to generate a chop signal that adjusts the switching connection of the plurality of switches to cause the operational amplifier to reduce a magnitude of the dark current generated by the detector.

2. The circuit of claim 1, wherein the integration circuit is operable to:

receive a signal that represents the dark current generated at the detector, wherein the signal is received at a terminal of the operational amplifier that has a negative input polarity based on a first switch configuration of the plurality of switches; and in response to receiving the chop signal generated by the chop signal generator, cause the terminal of the operational amplifier to have a positive input polarity corresponding to a negative feedback loop based on a second, different switch configuration of the plurality of switches.

3. The circuit of claim 2, wherein the integration circuit is operable to:

reduce the magnitude of the dark current generated by the detector based on a capacitor discharge voltage of the negative feedback loop that is discharged to reduce the magnitude of the dark current.

4. The circuit of claim 1, wherein the chop signal generator is operable to generate the chop signal that adjusts the switching connection of the plurality of switches to cause the operational amplifier to cancel the dark current generated by the detector.

5. The circuit of claim 1, wherein the integration circuit is operable to:

receive a first signal representing a detected voltage across the detector;

process the first signal to determine a minimum voltage across the detector; and adjust a gain of the operational amplifier based on a gain value that is set in accordance with the determined minimum voltage across the detector, wherein the gain value is used at the integration circuit for tuning the operational amplifier to reduce the magnitude of the dark current generated by the detector.

6. The circuit of claim 1, wherein:

the chop signal generator is further coupled to receive a clock signal derived from an output of the integration circuit; and the chop signal generator is operable to generate the chop signal to cause the operational amplifier to reduce the magnitude of the dark current in response to the clock signal derived from the output of the integration circuit.

7. The circuit of claim 6, further comprising:

a comparator circuit coupled between the output of the integration circuit and the chop signal generator, wherein the comparator circuit is operable to:

detect that a voltage signal corresponding to the output signal of the integration circuit exceeds a threshold reference voltage; and generate an comparator output signal that is used to derive the clock signal received by the chop signal generator.

8. The circuit of claim 1, wherein the dark current is proportional to a voltage signal generated across the detector when the optical sensing device is located in an environment that has no visible ambient light.

9. The circuit of claim 1, wherein the plurality of switches comprises:

a first set of switches comprising multiple transistor switches coupled at a first stage of the operational amplifier to switch a polarity associated with the first stage of the operational amplifier.

10. The circuit of claim 9, wherein the plurality of switches further comprises:

a second set of switches comprising multiple transistor switches coupled at a second stage of the operational amplifier to switch a polarity associated with the second stage of the operational amplifier.

11. The circuit of claim 10, wherein:

two or more of the transistor switches in the first set of switches are connected in a cross-coupled configuration relative to a first set of input terminals at the first stage of the operational amplifier; and two or more of the transistor switches in the second set of switches are connected in a cross-coupled configuration relative to a second set of input terminals at the second stage of the operational amplifier.

12. A method performed using an optical sensing device, the method comprising:

receiving, by an integration circuit, a signal that represents a dark current generated at a detector disposed in the optical sensing device;

generating, by a chop signal generator coupled to the integration circuit, a chop signal that adjusts a switching connection of a plurality of switches connected to an operational amplifier of the integration circuit;

adjusting the switching connection of the plurality of switches to change a polarity of the operational amplifier in response to the chop signal; and reducing, by the integration circuit, a magnitude of the dark current generated by the detector based on the change to the polarity of the operational amplifier.

* * * * *